United States Patent [19]
Hanawa et al.

[11] Patent Number: 5,572,151
[45] Date of Patent: Nov. 5, 1996

[54] PASS TRANSISTOR TYPE SELECTOR CIRCUIT AND DIGITAL LOGIC CIRCUIT

[75] Inventors: Makoto Hanawa, Niza; Kenji Kaneko, Sagamihara; Noriyasu Ido, Hadano, all of Japan

[73] Assignee: Hitachi, Ltd., Tokyo, Japan

[21] Appl. No.: 511,802

[22] Filed: Aug. 7, 1995

[30] Foreign Application Priority Data

Aug. 8, 1994 [JP] Japan .................................... 6-185808

[51] Int. Cl.$^6$ ............................................. H03K 19/0944
[52] U.S. Cl. ................................ 326/113; 326/21; 326/98
[58] Field of Search .................................. 326/21, 34, 93, 326/98, 113

[56] References Cited

U.S. PATENT DOCUMENTS

| | | | |
|---|---|---|---|
| 4,577,124 | 3/1986 | Koike | 326/113 |
| 5,015,581 | 5/1991 | Chappell et al. | 326/113 X |
| 5,059,828 | 10/1991 | Tanagawa | 326/98 X |
| 5,399,921 | 3/1995 | Dobbelaere | 326/21 X |
| 5,418,480 | 5/1995 | Hastie et al. | 326/113 |

FOREIGN PATENT DOCUMENTS 3-157723  7/1991  Japan .

OTHER PUBLICATIONS

N. Weste & K. Eshraghian, "Principles of CMOS VLSI Design", pp. 172–175, Addison–Wesley, 1985.

*Primary Examiner*—David R. Hudspeth
*Attorney, Agent, or Firm*—Antonelli, Terry, Stout & Kraus

[57] ABSTRACT

A pass transistor type selector circuit comprises a control signal supplying circuit for supplying a pair of control signals of opposite phases to the respective gate electrodes of a pair of nMOS transistors of a selecting circuit. The control signal supplying circuit includes a control signal interrupting means which operates in synchronism with a clock signal so as to selectively interrupt the supply of the control signals to the signal selecting circuit while the clock signal is low level. The control signal interrupting means is provided with a discharging means for discharging high-level one of the gate electrodes of the nMOS transistors of the signal selecting circuit while the clock signal is low level. The discharging means comprises two nMOS transistors, each connected between the respective gate electrodes of the nMOS transistors of the signal selecting circuit and a grounding terminal.

18 Claims, 8 Drawing Sheets

5,572,151

PASS TRANSISTOR TYPE SELECTOR CIRCUIT AND DIGITAL LOGIC CIRCUIT

BACKGROUND OF THE INVENTION

The present invention relates to a pass transistor type selector circuit and a digital logic circuit using the same.

As shown in FIG. 8 by way of example, a pass transistor type selector circuit can be formed by interconnecting the drain electrodes D of a pair of signal selecting transistors 1 and 2 (pass transistors). Each of the pass transistors is usually composed of an nMOS transistor which operates at a high speed.

When a pair of input signals are selectively applied to the source electrodes S of the transistors 1 and 2 and a pair of control signals are selectively applied to the gate electrodes G of those transistors, this selector circuit functions as a two-input exclusive-OR circuit. Refer to, for example, N. Weste and K. Eshraghian, "Principles of CMOS VLSI Design", pp. 172–175, Addison-Wesley, 1985.

The pass transistor type selector circuit can be composed of a relatively small number of circuit elements. Accordingly, this type of selector circuit is particularly suitable for assembling a digital logic circuit having a desired high speed, by using the technology of VLSI (very-large-scale integration).

FIG. 9a shows the waveforms of the pair of control signals Z and $\bar{Z}$. The first control signal Z is applied to the gate electrode G of the first transistor 1, the level of which is kept high during the period indicating logic "1" and is kept low during the period indicating logic "0". The second control signal $\bar{Z}$ which is a negative signal (negation) having a opposite phase to the first control signal Z is applied to the gate electrode G of the transistor 2. The level of this signal is kept low while the level of the first signal Z is kept high and is kept high while the level of the first signal Z is kept low.

In case of the above-mentioned conventional circuit, it is difficult to avoid such a phenomenon that both of the transistors 1 and 2 become conductive simultaneously during a short period T, because both of the control signals Z and $\bar{Z}$ tend to exceed a fixed threshold level in the process of turning over of those signals. If such a phenomenon once occurred, the input signals applied to the respective source electrodes S of the transistors 1 and 2 pass through those transistors and collide with each other on the side of the drain electrodes D (output terminal). This collision causes an undesirable delay of circuit stabilization which brings about some obstruction of high-speed operation.

Similar problem also arises in case that a certain control signal for one of the pair of pass transistors is inverted by an inverter to use as a control signal for the other transistor. In this case, as a result that the timing of level change or phase change of the latter signal is delayed by the delay time originated from the characteristics of the inverter, there occurs an undesirable short period in which both of the pair of pass transistors become conductive simultaneously.

SUMMARY OF THE INVENTION

It is an object of the present invention to provide a pass transistor type selector circuit solving those problems in the prior art and capable of stably operating at a high operating speed, and to provide a novel digital circuit using such a selector circuit.

For the purpose of achieving the object, the selector circuit according to the present invention comprises: a signal selecting circuit composed of a pair of signal selecting nMOS transistors whose drain electrodes are commonly connected so as to form an output terminal; a control signal generating circuit for generating a pair of control signals of opposite phases; a control signal supplying circuit for supplying the control signals to the respective gate electrodes of the nMOS transistors; and an input signal supplying circuit for supplying input signals to the respective source electrodes of the nMOS transistors.

The control signal supplying circuit is required to include a control signal interrupting means which operates in synchronism with a clock signal so as to selectively interrupt the supply of the control signals to the signal selecting circuit while the clock signal level is low.

It is desirable that this interrupting means comprises a charging means for charging an output terminal of the control signal generating circuit while the clock signal level is low, and a discharging means for discharging at least high-level one of the gate electrodes of the nMOS transistors while the clock signal level is low.

The charging means can be realized by using two pMOS transistors, each connected between the respective output terminals of the control signal generating circuit and the power supply terminal. On the other hand, the discharging means can be realized by using two nMOS transistors, each connected between the respective gate electrodes of the nMOS transistors of the signal selecting circuit and a grounding terminal.

When the high-level one of the gate electrodes of the nMOS transistors is discharged while the clock signal level is low, the waveforms of the control signals change from those shown in FIG. 9a to those shown in FIG. 9b. The transition of level of both the control signals Z and $\bar{Z}$ is shifted in the direction of the arrows shown in FIG. 9b only when the transition of the control signal level from high to low occurs. And the control signals change from the waveforms indicated by alternate long and short dash lines to those indicated by continuous lines. The magnitude of the shift is substantially equal to the time in which the clock signal level is low. The times when the transition of the signal level from low to high are not changed. Thus, the short period T in which both of the control signals exceed the fixed threshold level can be eliminated, and the collision of the input signals due to the simultaneous switching on action of both the transistors is avoided. Consequently, the high speed operation of the selector circuit can be secured.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

Figure 1:
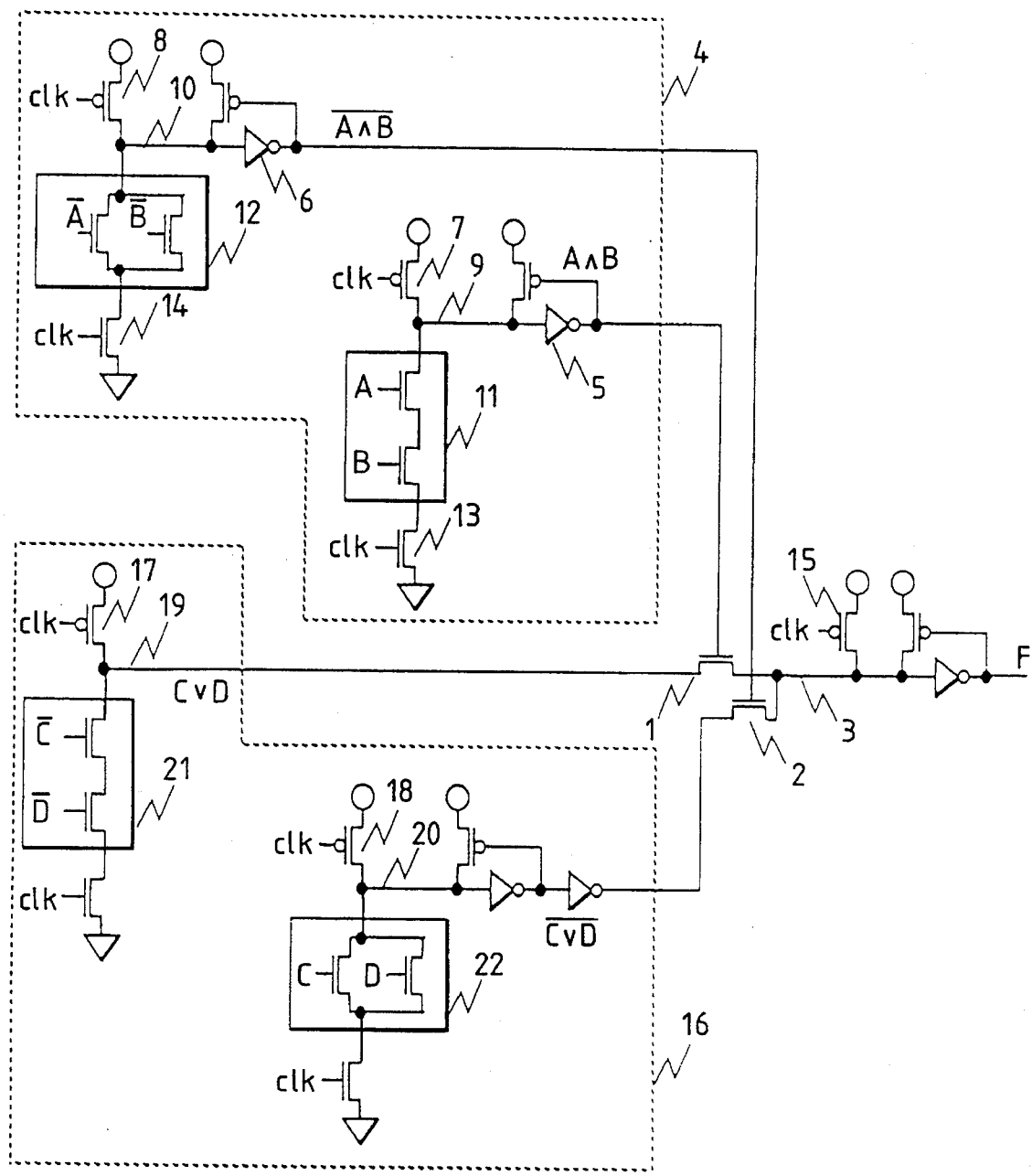
FIG. 1 is a circuit diagram of a MOS transistor logic circuit in an embodiment 1 according to the present invention.

Pass transistor type selector circuits and logic circuits embodying the present invention will be described in detail with reference to the accompanying drawings. In FIGS. 1, 3 and 5 to 7, the same or corresponding parts are designated by the same reference characters.

Embodiment 1

Figure 2:
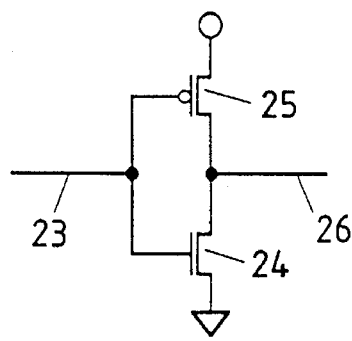
FIG. 2 is a circuit diagram of an inverter.

Referring to FIG. 1, there are shown a pair of signal selecting nMOS transistors 1 and 2 composing a signal selecting circuit, an output terminal 3 connected to the respective drain electrodes of the nMOS transistors 1 and 2, a control signal circuit 4 defined first as a circuit which comprises a control signal supplying circuit and a control signal generating circuit, and is constructed by using two of generally known domino logic circuits (pp. 168–169 in the above mentioned reference), inverter circuits 5 and 6, charging pMOS transistors 7, 8, 17 and 18, nMOS logic blocks 11 and 12 of the domino logic circuits serving as control signal generating circuit, a voltage compensating pMOS transistor 15, an input signal supplying circuit 16 constructed by using two of generally known dynamic CMOS logic circuits (pp. 168–169 in the above mentioned reference), and nMOS logic blocks 21 and 22 of the same dynamic circuits, serving as input signal generating means. The output terminals of the inverter circuits 5 and 6 are connected to the gate electrodes of the signal selecting nMOS transistors 1 and 2, respectively. The drain electrodes of the charging pMOS transistors 7 and 8, and the output terminals 9 and 10 of the nMOS logic blocks 11 and 12 are connected to the input terminals of the inverter circuits 5 and 6, respectively. Thus, the output signals of the nMOS logic blocks 11 and 12 are inverted and the inverted output signals are applied as control signals to the gate electrodes of the signal selecting nMOS transistors 1 and 2, respectively. The nMOS logic blocks 11 and 12 generate logic signals having mutually opposite phases, respectively. The charging pMOS transistors 7 and 8 function as a charging means of a control signal interrupting means. As shown in FIG. 2, each of the inverter circuits 5 and 6 comprises a discharging nMOS transistor 24, a charging pMOS transistor 25, an input terminal 23 connected to the gate electrodes of the transistors 24 and 25, and an output terminal 26 connected to the drain electrodes of the same. The discharging nMOS transistor 24 functions as a discharging means of the control signal interrupting means. The source electrode of the discharging nMOS transistor 24 is grounded, and the source electrode of the charging pMOS transistor 25 is connected to a power supply terminal. When an input signal applied to the input terminal 23 becomes high level, the discharging nMOS transistor 24 becomes conductive to discharge the charge stored in the electrical capacity of the output terminal 26. Consequently, the output terminal becomes low level. The electrical capacity includes the gate capacity of the gate electrode of the signal selecting nMOS transistor 1 (or 2), the junction capacities of the drain electrodes of the discharging nMOS transistor 24 and the charging pMOS transistor 25, and the floating capacity of the wiring. When the input signal applied to the input terminal 23 becomes low level, the charging pMOS transistor 25 becomes conductive to charge the electrical capacity of the output terminal 26 and, consequently, the output terminal 26 becomes high level.

A clock signal clk is applied to the gate electrodes of the charging pMOS transistors 7 and 8, and the source electrodes of the charging pMOS transistors 7 and 8 are connected to the power supply terminal. In a period where the level of the clock signal clk is low, the charging pMOS transistors 7 and 8 are conductive, and the discharging nMOS transistors 13 and 14 connected to the other output terminals of the nMOS logic blocks 11 and 12 are non-conductive to open the output terminals 9 and 10. Consequently, the electrical capacities of the output terminals 9 and 10 are charged through the charging pMOS transistors 7 and 8, and the output terminals 9 and 10 become high level.

Subsequently, when the clock signal clk becomes high, the charging pMOS transistors 7 and 8 become non-conductive, and the discharging nMOS transistors 13 and 14 become conductive to ground the other output terminals of the nMOS logic blocks 11 and 12. On the other hand, the output two-terminal of each of the nMOS logic blocks 11 and 12 which is formed by both the output terminal 9 (or 10) and the other output terminal is non-conductive (open) or conductive according to the results of logical operation when the level of the clock signal clk is high. Thus, the output terminals 9 and 10 hold the charges charged in their electrical capacities and remain high level when the output two-terminals are non-conductive or discharge the charges and become low level when the output two-terminals are conductive. The output terminals 9 and 10 remain high level if the output terminals 9 and 10 have been charged and high level before the clock signal becomes low level according to the results of logical operation.

Figure 9A:
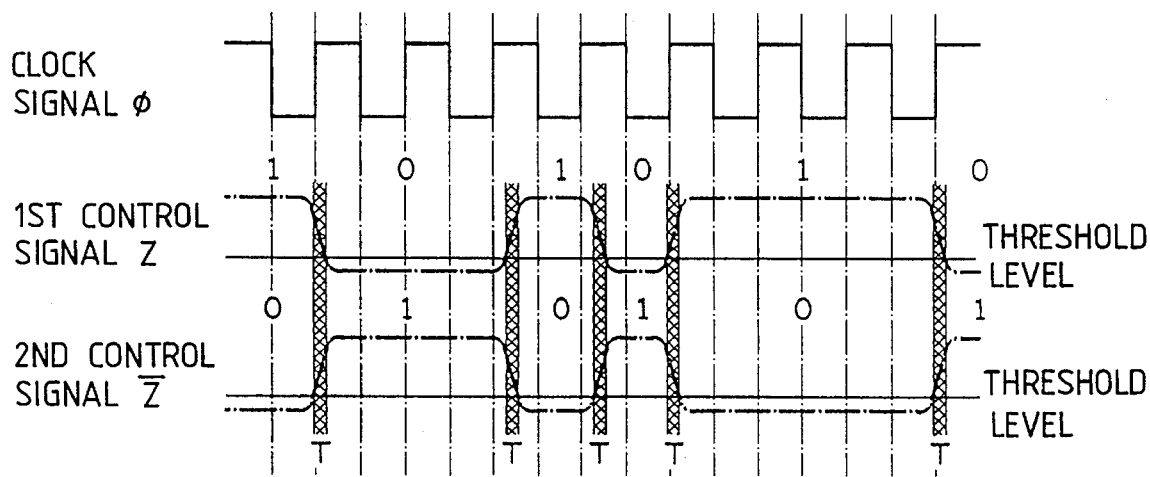
FIG. 9a is a waveform chart of assistance in explaining control signals supplied by a conventional control signal supplying circuit.
Figure 9B:
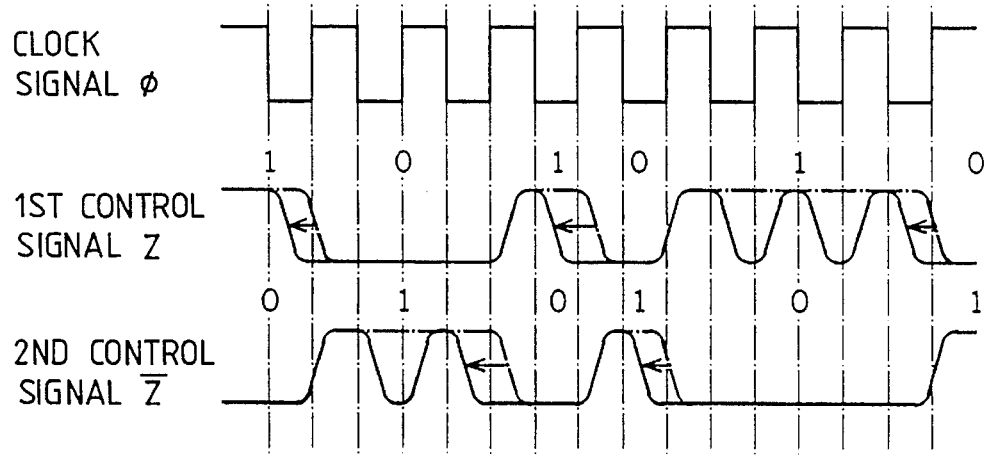
FIG. 9b is a waveform chart of assistance in explaining control signals supplied by a control signal supplying circuit in accordance with the present invention.

Since the nMOS logic blocks 11 and 12 generate logic signals having mutually opposite phases, respectively, for example, when the nMOS logic block 11 is non-conductive, the nMOS logic block 12 becomes conductive, the output terminal 9 becomes high level and the output terminal 10 becomes low level. The output terminal 9 becomes high level in advance by about a time corresponding to the period of low level of the clock signal; that is, the output terminal 9 becomes high level before the output terminal 10 becomes low level, and there is a time difference between the time when the output terminal 9 becomes high level and the time when the output terminal 10 becomes low level. The charging transistors 7 and 8 make the output terminals 9 and 10 to become high level in advance by about a time corresponding to the period of low level of the clock signal, so the operation of the charging transistors 7 and 8 can be called pre-charging. Consequently, control signals as shown in FIG. 9b obtained by inverting those are provided. When the output terminal 9 becomes low level and the output terminal 10 becomes high level, the output terminal 10 becomes high level before the output terminal 9 becomes low level. Thus, the collision of the input signals due to the pair of signal selecting nMOS transistors 1 and 2 simultaneously becoming conductive can be avoided, so that the high speed operation of the selector circuit can be secured.

Figure 3:
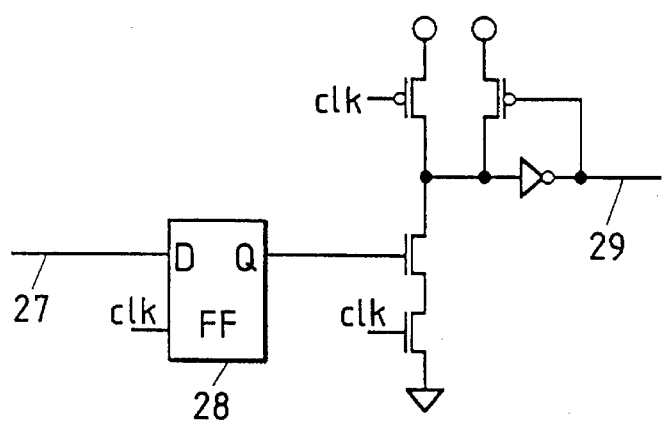
FIG. 3 is a circuit diagram of a waveform shaping circuit for shaping the waveforms of external signals.

If the nMOS logic block 11 or 12 changes from conductive to non-conductive in a period where the level of the clock signal clk is high, the output terminal 9 or 10, which is to remain high level, is discharged and becomes low level to cause malfunction. Therefore, the input signals applied to the nMOS logic blocks 11 and 12 must be completed at least before the clock signal clk becomes high level to avoid such a trouble. FIG. 3 shows a waveform shaping circuit employed for obtaining such input signals. An input signal is applied to a terminal 27, a flip-flop 28 decides a state when the clock signal clk becomes high level, a domino logic circuit converts the input signal into a signal that becomes low level in each cycle while the level of the clock signal clk is low, and the signal is sent out through a terminal 29.

The voltage compensating pMOS transistor 15 is connected to the output terminal 3 connected to the drain electrodes of the signal selecting nMOS transistors 1 and 2. The clock signal clk is applied to the gate electrode of the voltage compensating pMOS transistor 15, and the source electrode of the same is connected to the power supply terminal. When both of the control signal applied to the gate electrode of the signal selecting transistor and the input signal applied to the source electrode of the same are high level, the output signal level is high. The MOS transistor has a threshold voltage and the high level of the output signal drops by a value corresponding to the threshold voltage. When selector circuits are cascaded, voltage drops are accumulated in a large voltage drop, and a through current flows at the CMOS buffer circuit in the next stage to increase power consumption. The voltage compensating pMOS transistor 15 operates in synchronism with a clock signal and becomes conductive while the clock signal level is low to restore the voltage level of the output terminal 3 to the power supply voltage.

One output terminal 19 of the nMOS logic block 21 of the dynamic CMOS logic circuit serving as an input signal generating circuit is connected to the source electrode of the signal selecting nMOS transistor 1, and one output terminal 20 of the nMOS logic block 22 is connected through a buffer having a high driving force to the source electrode of the signal selecting nMOS transistor 2. Thus the output signals of the nMOS logic blocks 21 and 22 are applied as input signals to the respective source electrodes of the signal selecting nMOS transistors 1 and 2. The drain electrodes of the charging pMOS transistors 17 and 18 are connected to the output terminals 19 and 20, respectively. The clock signal clk is applied to the gate electrodes of the charging pMOS transistors 17 and 18. The source electrodes of the charging pMOS transistors 17 and 18 are connected to the power supply terminal. The charging pMOS transistors 17 and 18 are conductive while the level of the clock signal clk is low, the electrical capacities of the output terminals 19 and 20 are charged, and the output terminals 19 and 20 become high level. Thus the input signals applied to the signal selecting nMOS transistors 1 and 2 can be changed from low level to high level only by the clock signal.

Figure 4:
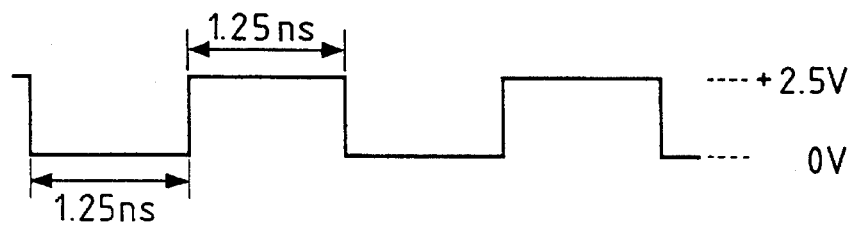
FIG. 4 is a diagram of assistance in explaining a clock signal used by the embodiment 1.

Then, the charging pMOS transistors 17 and 18 are non-conductive and the output terminals of each of the nMOS logic blocks 21 and 22 are conductive or non-conductive (open) depending on the results of logical operation while the level of the clock signal clk is high. Consequently, the electrical capacities of the output terminals 19 and 20 remain charged and high level or are discharged and become low level. The input signals are given through the waveform shaping circuit shown in FIG. 3 to the nMOS blocks 21 and 22. Thus the signals that appear on the output terminals 19 and 20 become high level in each cycle while the level of the clock signal clk is low, and become low level depending on the results of logical operation carried out by the nMOS logic blocks 21 and 22 while the level of the clock signal clk is high. Accordingly, The input signals applied to the signal selecting nMOS transistors 1 and 2, similarly to the control signals, are synchronous with the clock signal clk, and the accidental drop of the levels thereof does not occur while the level of the clock signal clk is high. Consequently, the malfunction of the signal selecting nMOS transistors 1 and 2 can be avoided so that those 1 and 2 may surely function. Concretely, signals A, B, C and D, and their negative signals $\overline{A}$, $\overline{B}$, $\overline{C}$ and $\overline{D}$ were given in this embodiment. And a signal F which is the exclusive-OR of the A∧B signal (hereinafter AND operation is indicated by "∧") of the signals A and B and the C∨D signal (hereinafter OR operation is indicated by "∨") of the signals C and D was obtained. The two control signals are A∧B and $\overline{A \wedge B}$. The selector circuit was tested by us using a supply voltage of 2.5 V, and a clock signal having a low level of 0 V, a high level of +2.5 V, a frequency of 400 MHz, a period of low level of 1.25 ns and a period of high level of 1.25 ns (FIG. 4), and it was confirmed that the signal F can be stably obtained.

Embodiment 2

Figure 5:
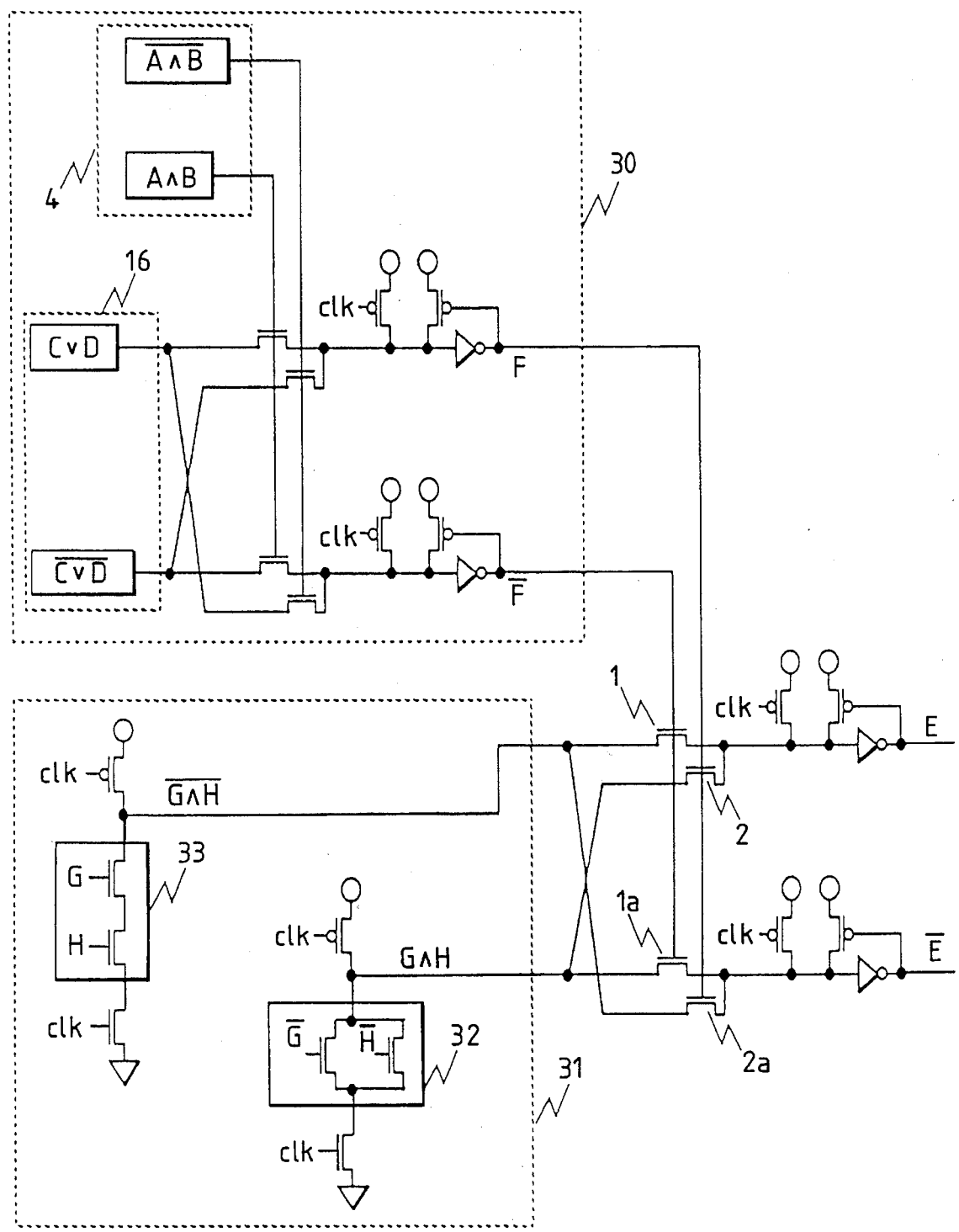
FIG. 5 is a circuit diagram of a MOS transistor logic circuit in an embodiment 2 according to the present invention.

Referring to FIG. 5, there are shown a control signal circuit 30 employing two pass transistor type selector circuits embodying the present invention, an input signal supplying circuit 31 employing a dynamic CMOS logic circuit, nMOS logic blocks 32 and 33 serving as input signal generating means of the same dynamic circuits, signal selecting nMOS transistors 1 and 2, and signal selecting nMOS transistors 1a and 2a that provide logic signals which are the same as and opposite in phase to the output signals of those 1 and 2.

Basically, one selector circuit of the control signal circuit 30 is the same in configuration as that of the embodiment 1. The control signal circuit 30 uses two sets of selector circuits inversely connected to the source electrodes, and provides the control signals F and $\overline{F}$. They are applied to the gate electrodes of the signal selecting nMOS transistors 1, 2, 1a and 2a. Voltage compensating pMOS transistors are connected to the output terminals of the signal selecting nMOS transistors of the control signal circuit 30, and the control signals are sent out through inverter circuits. The inverter circuits are the same as the aforesaid inverter circuits 5 and 6. The discharging nMOS transistors of the inverter circuits function for interrupting signals and discharging, and the charging pMOS transistors of the same function for charging.

Other voltage compensating pMOS transistors are connected to the output terminals of the signal selecting nMOS transistors 1 and 2, and the output terminals of the signal selecting nMOS transistors 1a and 2a, respectively, to restore the high level that drops by a value corresponding to a threshold voltage to the level of the power supply voltage.

The source electrodes of the nMOS transistors 1, 2, 1a and 2a, similarly to those of the embodiment 1, are connected to an input signal supplying circuit 31 employing dynamic CMOS logic circuits. The buffer circuit employed in one of the dynamic CMOS logic circuits of the embodiment 1 is omitted. Charging pMOS transistors are connected to the output terminals of the nMOS logic blocks 32 and 33, respectively. Input signals are given through the waveform shaping circuit shown in FIG. 3 to the nMOS logic blocks 32 and 33.

In this embodiment, signals G, H, $\overline{G}$ and $\overline{H}$ were given in addition to the signals used in the embodiment 1. And a signal E which is the exclusive-OR of the signal F and the G∧H signal of the signals G and H, and the negative signal $\overline{E}$ of the signal E were obtained. The selector circuit was tested by using a supply voltage of 2.5 V, and a clock signal having a low level of 0 V, a high level of +2.5 V, a frequency of 400 MHz, a period of low level of 1.25 ns and a period of high level of 1.25 ns (FIG. 4), and it was confirmed that the signals E and $\overline{E}$ can be stably obtained.

Embodiment 3

Figure 6:
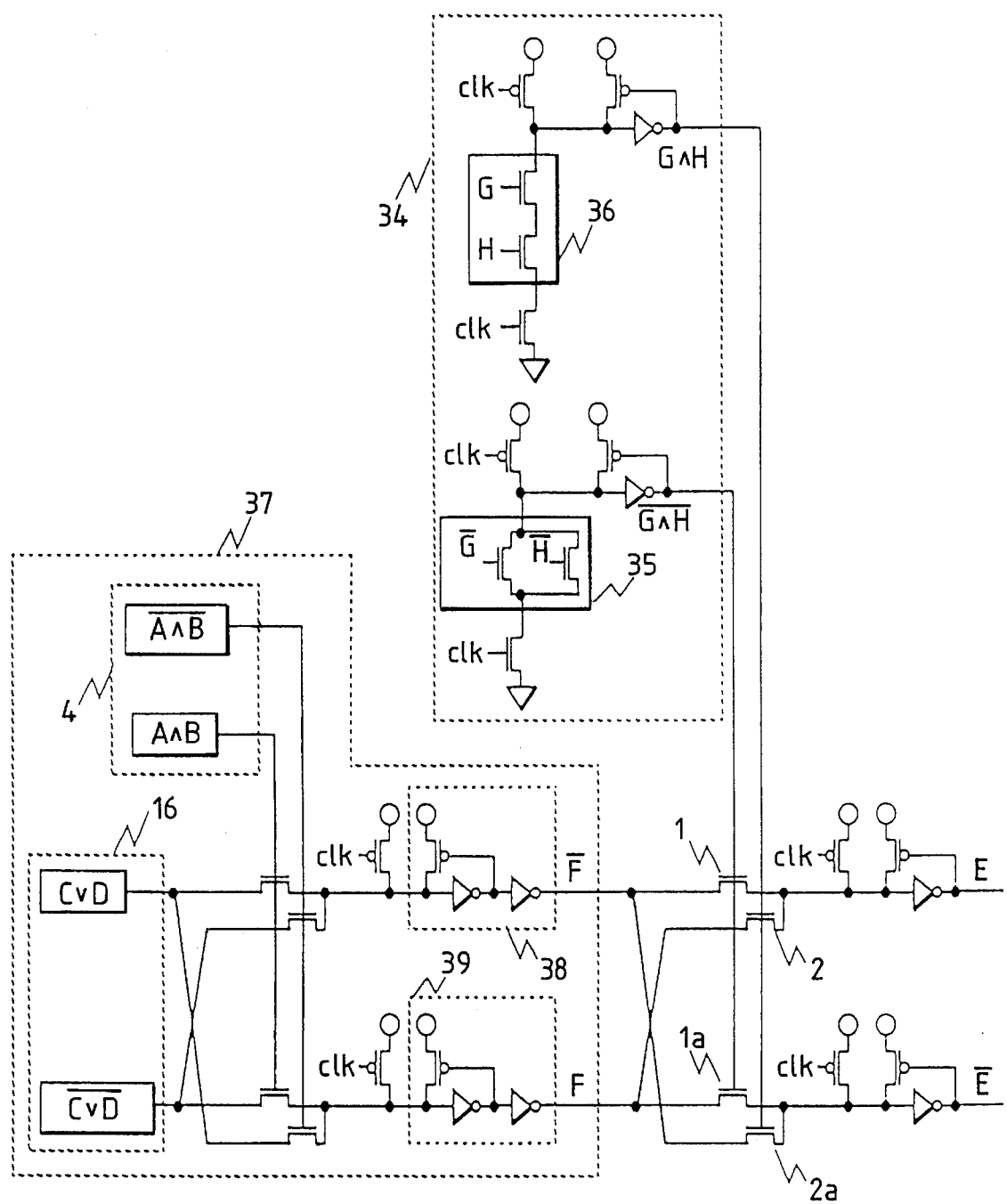
FIG. 6 is a circuit diagram of a MOS transistor logic circuit in an embodiment 3 according to the present invention.

Referring to FIG. 6, there are shown a control signal circuit 34 employing two domino logic circuits, nMOS logic blocks 35 and 36 of domino logic circuit serving as control signal generating circuits, an input signal supplying circuit 37 comprising two pass transistor type selector circuits in accordance with the present invention, and buffer circuits 38 and 39.

The control signal circuit 34 is similarly to that of the embodiment 1. Signals G, H, $\overline{G}$ and $\overline{H}$, which are the same as those used in the embodiment 2, are given to the nMOS logic blocks 35 and 36 serving as control signal generating circuit to obtain control signals G∧H and $\overline{G∧H}$. The control signals are applied to the gate electrodes of the signal selecting nMOS transistors 1, 2, 1a and 2a.

Voltage compensating pMOS transistors are connected respectively to the output terminal of the signal selecting nMOS transistors 1 and 2, and the another output terminal of the signal selecting nMOS transistors 1a and 2a.

The input signal supplying circuit 37 comprising two pass transistor type selector circuits is connected to the source electrodes of the signal selecting nMOS transistors 1, 2, 1a and 2a. The input signal supplying circuit 37 is similar to the control signal circuit 30 of the embodiment 2, except that the input signal supplying circuit 37 is provided with buffer circuits 38 and 39 instead of the inverter circuits. The input signal supplying circuit 37 gives signals F and $\overline{F}$, which are the same as those used in the embodiment 2, to the signal selecting nMOS transistors 1, 2, 1a and 2a. In this embodiment, the signals E and $\overline{E}$, which are the same as those of the embodiment 2, was obtained by calculating the exclusive-OR of the signals F and G∧H. The selector circuit was tested by using a supply voltage of 2.5 V, and a clock signal having a low level of 0 V, a high level of +2.5 V, a frequency of 400 MHz, a period of low level of 1.25 ns and a period of high level of 1.25 ns (FIG. 4), and it was confirmed that signals E and $\overline{E}$ can be stably obtained.

Figure 7:
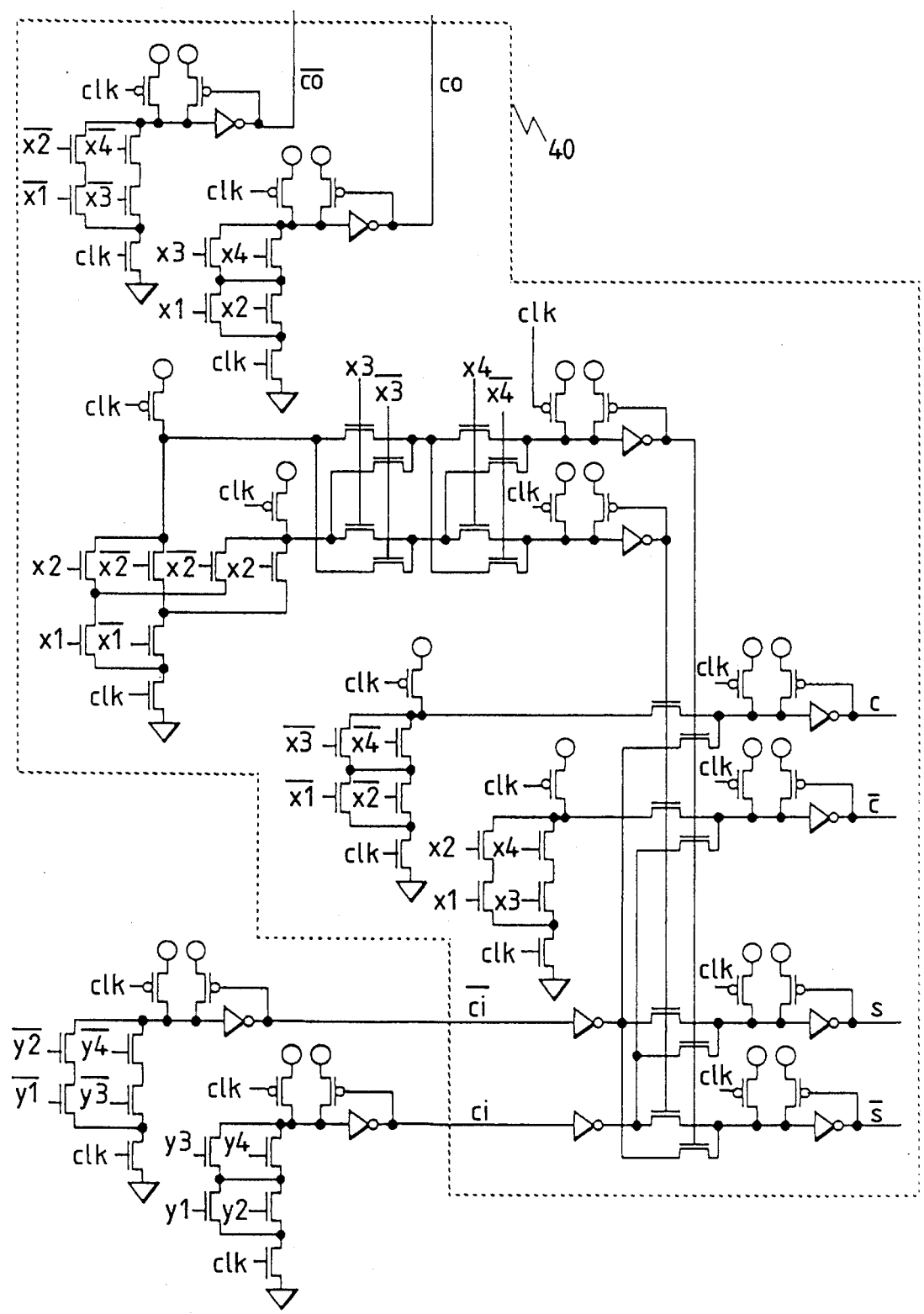
FIG. 7 is a circuit diagram of assistance in explaining the application of a MOS transistor logic circuit in accordance with the present invention to a compressor circuit.
Figure 8:
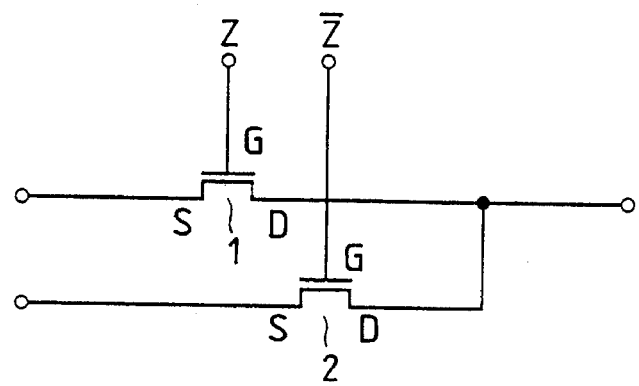
FIG. 8 is a circuit diagram of a conventional pass transistor type selector circuit.

The embodiment was applied to a 4:2 compressor circuit. The 4:2 compressor circuit is a basic unit (adder array) of a multiplier. FIG. 7 shows one of the blocks 40. The block 40 is a logic circuit that adds 4-bit inputs X1, X2, X3 and X4 and provides 2-bit outputs S and C. The output C is a sum at one higher place. A character Co shows a carry-out signal for carrying into one higher place, and a character Ci shows a carry-in signal for carrying from one lower place.

In this application, four pass transistor type selector circuits each of a pair of signal selecting nMOS transistors were used for constructing the 4:2 compressor circuit. Tests proved that high speed signals synchronous with a frequency of 400 MHz can be stably obtained.

Figure 10:
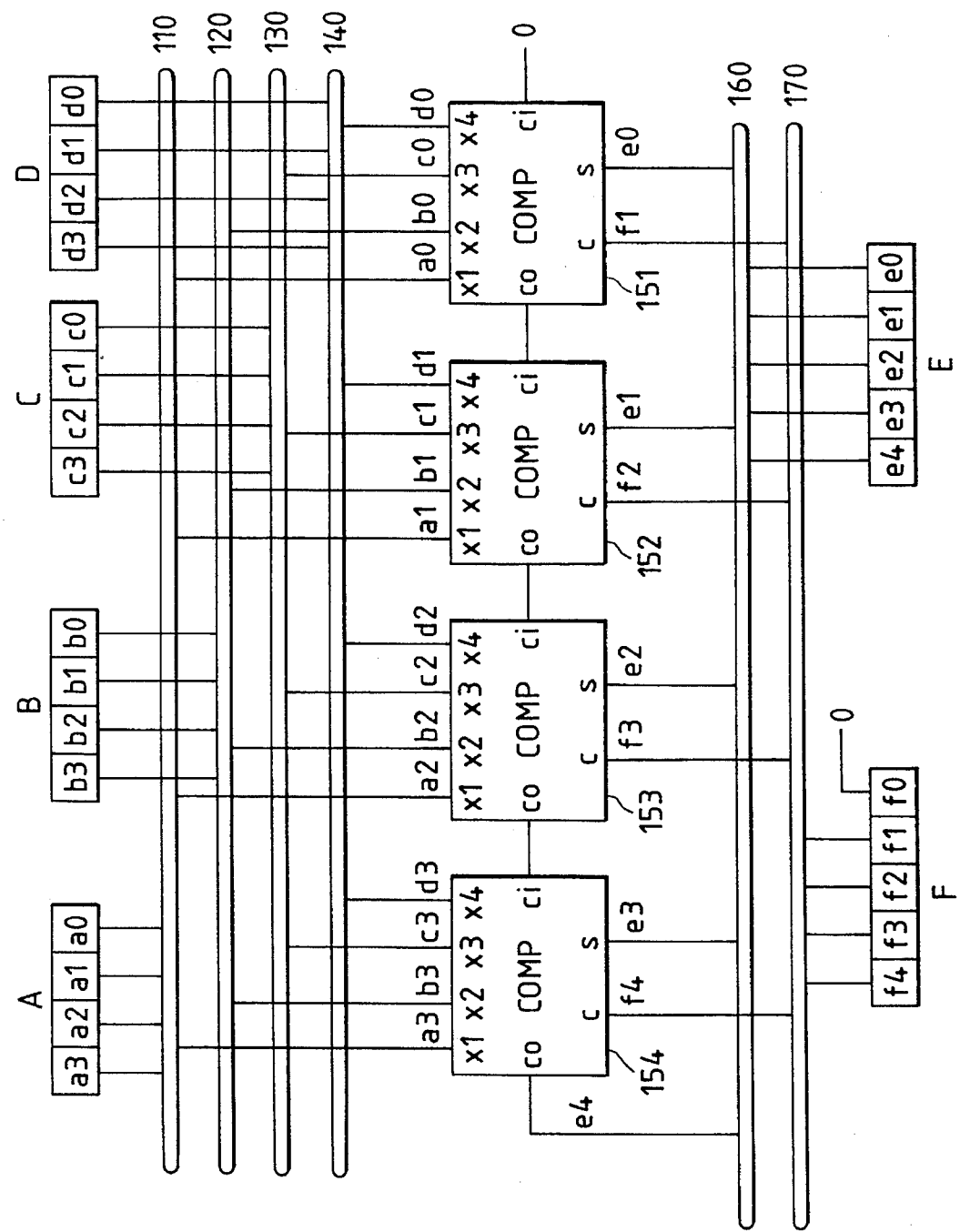
FIG. 10 is a block diagram of assistance in explaining the application of a MOS transistor logic circuit to an adder.

FIG. 10 shows an adder constructed by using four 4:2 compressor circuits 151 to 154 of the aforesaid configuration. The adder is a carry save adder that adds 4-bit data A of a3 to a0, B of b3 to b0, C of c3 to c0 and D of d3 to d0, and provides 5-bit data E of e4 to e0, and F of f4 to f0. Bits of the data A, B, C and D are transferred through signal buses 110, 120, 130 and 140 to 4:2 compressor circuits 151 to 154. The 4:2 compressor circuit 151 adds the least significant bits, the 4:2 compressor circuits 152 and 153 add the next least significant bits and the next least significant bits but one, respectively, and the 4:2 compressor circuit 154 adds the most significant bits. The sums of bits are put together into the two 5-bit data E and F on signal buses 160 and 170. The adder comprising the pass transistor type selector circuits in accordance with the present invention could operate stably at a high operating speed.

Since the aforesaid adder is a carry save adder, the adder can be applied to the addition of partial products on a multiplier. A multiplier incorporating a 4-bit carry save adder is shown in FIG. 3 of Japanese Patent Laid-open (Kokai) No. Hei 3-157723. When the adder comprising the pass transistor type selector circuits in accordance with the present invention was incorporated into the aforesaid multiplier, the multiplier could operate stably at a high operating speed.

Figure 11:
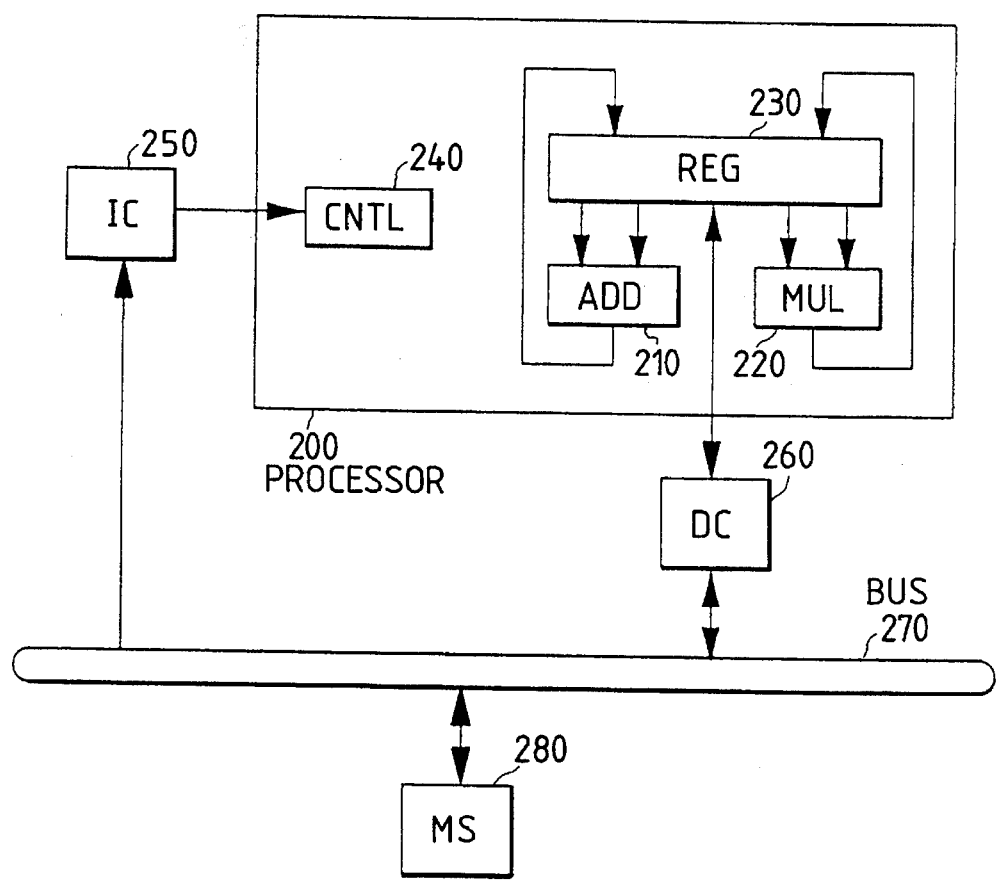
FIG. 11 is a block diagram of assistance in explaining the application of a MOS transistor logic circuit to a processor.

The aforesaid adder and the multiplier can be used as components of a processor. FIG. 11 shows a processor 200 incorporating an adder 210 of the aforesaid configuration and a multiplier 220 of the aforesaid configuration in combination with a register file 230 and a control circuit 240. The adder 210 and the multiplier 220 read data from the register file 230, operate the data, and store the results of operations in the register file 230. The control circuit 240 controls these operations of the adder 210 and the multiplier 220. The control circuit 240 reads programs from an instruction cache 250 and controls the adder 210 and the multiplier 220 of the processor 200 according to the programs. A data cache 260 stores data, and data are transferred between the data cache 260 and the register file 230. The instruction cache 250 and the data cache 260 are connected to a main memory 280 by a bus 270, and holds copies of part of the contents of the main memory 280.

Arithmetic circuits such as adders and multipliers are the principal components of a processor. An arithmetic circuit capable of stably operating at a high operating speed could be realized by using the pass transistor type selector circuits of the present invention.

According to the present invention, the level transition times of control signals having mutually opposite phases can be shifted relative to each other to avoid the collision of the output signals of the signal selecting nMOS transistors which are elements of the pass transistor type selector circuit, so that the circuit is able to operate at a high operating speed. The drop of the levels of the output signal by a value corresponding to the threshold voltage can be compensated. Furthermore, since such malfunction that may occur while the clock signal level is high can be avoided, the circuit operation can be kept stable. The pass transistor type selector circuit featured by its small scale is suitable for application to a large-scale integrated circuit. A large-scale integrated circuit incorporating the pass transistor type selector circuits is effectively applicable to high-performance parallel processors, scientific computers, super computers, vector computers, general-purpose computers, work stations and servers.

It is further understood by those skilled in the art that foregoing description is a preferred embodiment of the disclosed device and that various changes and modifications may be made in the invention without departing from the spirit and scope thereof.

What is claimed is:

1. A pass transistor type selector circuit comprising:
    a signal selecting circuit composed of a pair of signal selecting nMOS transistors whose drain electrodes are commonly connected so as to form an output terminal, and also including a pMOS transistor, wherein said pMOS transistor is connected between the output terminal of the signal selecting circuit and a power supply terminal, and wherein a gate electrode of said pMOS transistor is connected to an output terminal of an inverter connected to the output terminal of the signal selecting circuit;
    a control signal generating circuit for generating a pair of control signals of opposite phases;
    a control signal supplying circuit for supplying the control signals to the respective gate electrodes of the nMOS transistors of said signal selecting circuit;
    an input signal supplying circuit for supplying input signals to the respective source electrodes of the nMOS transistors of said signal selecting circuit; and
    said control signal supplying circuit including a control signal interrupting means which operates in synchronism with a clock signal so as to selectively interrupt the supply of the control signals to the signal selecting circuit while the clock signal level is low.

2. A pass transistor type selector circuit comprising:
    a signal selecting circuit composed of a pair of signal selecting nMOS transistors whose drain electrodes are commonly connected so as to form an output terminal,
    a control signal generating circuit for generating a pair of control signals of opposite phases,
    a control signal supplying circuit for supplying the control signals to the respective gate electrodes of the nMOS transistors of said signal selecting circuit,
    an input signal supplying circuit for supplying input signals to the respective source electrodes of the nMOS transistors of said signal selecting circuit,
    said control signal supplying circuit including a control signal interrupting means which operates in synchronism with a clock signal so as to selectively interrupt the supply of the control signals to the signal selecting circuit while the clock signal level is low, wherein said control signal supplying circuit and said control signal generating circuit is composed of a domino logic circuit.

3. A pass transistor type selector circuit according to claim 1, wherein said control signal interrupting means comprises a charging means for charging an output terminal of the control signal generating circuit while the clock signal level is low, and a discharging means for discharging at least high-level one of the gate electrodes of the nMOS transistors of said signal selecting circuit while the clock signal level is low.

4. A pass transistor type selector circuit according to claim 3, wherein said charging means comprises two pMOS transistors, each connected between the respective output terminals of said control signal generating circuit and the power supply terminal.

5. A pass transistor type selector circuit according to claim 3, wherein said discharging means comprises two nMOS transistors, each connected between the respective gate electrodes of the nMOS transistors of said signal selecting circuit and a grounding terminal.

6. A pass transistor type selector circuit according to claim 5, wherein each of said discharging nMOS transistors forms at least one element of an inverter circuit for inverting the phase of the output signal of said control signal generating circuit.

7. A pass transistor type selector circuit according to claim 1, further comprising a voltage compensating pMOS transistor connected between the output terminal of said signal selecting circuit and the power supply terminal, which becomes conductive in synchronism with the clock signal while the clock signal level is low, so as to restore the potential of the output terminal to a power source voltage.

8. A pass transistor type selector circuit comprising:
    a signal selecting circuit composed of a pair of signal selecting nMOS transistors whose drain electrodes are commonly connected so as to form an output terminal,
    a control signal generating circuit for generating a pair of control signals of opposite phases,
    a control signal supplying circuit for supplying the control signals to the respective gate electrodes of the nMOS transistors of said signal selecting circuit,
    an input signal supplying circuit for supplying input signals to the respective source electrodes of the nMOS transistors of said signal selecting circuit,
    said control signal supplying circuit including a control signal interrupting means which operates in synchronism with a clock signal so as to selectively interrupt the supply of the control signals to the signal selecting circuit while the clock signal level is low, wherein said input signal supplying circuit is composed of a dynamic logic circuit.

9. A pass transistor type logic circuit composed of a plurality of pass transistor type selector circuits, each comprising:
    a signal selecting circuit composed of a pair of signal selecting nMOS transistors whose drain electrodes are commonly connected so as to form an output terminal;
    a control signal generating circuit for generating a pair of control signals of opposite phases;
    a control signal supplying circuit for supplying the control signals to the respective gate electrodes of the nMOS transistors of said signal selecting circuit;
    an input signal supplying circuit for supplying input signals to the respective source electrodes of the nMOS transistors of said signal selecting circuit; and
    said control signal supplying circuit including a signal interrupting means which operates in synchronism with a clock signal so as to selectively interrupt the supply of the control signals to the signal selecting circuit while the clock signal level is low.

10. A pass transistor type selector circuit according to claim 2, wherein said control signal interrupting means comprises a charging means for charging an output terminal of the control signal generating circuit while the clock signal level is low, and a discharging means for discharging at least high-level one of the gate electrodes of the nMOS transistors of said signal selecting circuit while the clock signal level is low.

11. A pass transistor type selector circuit according to claim 10, wherein said charging means comprises two pMOS transistors, each connected between the respective output terminals of said control signal generating circuit and the power supply terminal.

12. A pass transistor type selector circuit according to claim 10, wherein said discharging means comprises two nMOS transistors, each connected between the respective gate electrodes of the nMOS transistors of said signal selecting circuit and a grounding terminal.

13. A pass transistor type selector circuit according to claim 12, wherein each of said discharging nMOS transistors forms at least one element of an inverter circuit for inverting the phase of the output signal of said control signal generating circuit.

14. A pass transistor type selector circuit according to claim 8, wherein said control signal interrupting means comprises a charging means for charging an output terminal of the control signal generating circuit while the clock signal level is low, and a discharging means for discharging at least high-level one of the gate electrodes of the nMOS transistors of said signal selecting circuit while the clock signal level is low.

15. A pass transistor type selector circuit according to claim 14, wherein said charging means comprises two pMOS transistors, each connected between the respective output terminals of said control signal generating circuit and the power supply terminal.

16. A pass transistor type selector circuit according to claim 14, wherein said discharging means comprises two nMOS transistors, each connected between the respective gate electrodes of the nMOS transistors of said signal selecting circuit and a grounding terminal.

17. A pass transistor type selector circuit according to claim 16, wherein each of said discharging nMOS transistors forms at least one element of an inverter circuit for inverting the phase of the output signal of said control signal generating circuit.

18. A pass transistor type selector circuit according to claim 8, further comprising a voltage compensating pMOS transistor connected between the output terminal of said signal selecting circuit and the power supply terminal, which becomes conductive in synchronism with the clock signal while the clock signal level is low, so as to restore the potential of the output terminal to a power source voltage.

\* \* \* \* \*